(12) United States Patent
Kikugawa

(10) Patent No.: US 8,571,233 B2
(45) Date of Patent: Oct. 29, 2013

(54) SIGNAL CHARACTERISTIC ADJUSTMENT APPARATUS AND SIGNAL CHARACTERISTIC ADJUSTMENT METHOD

(75) Inventor: Yusaku Kikugawa, Ome (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1077 days.

(21) Appl. No.: 12/561,421

(22) Filed: Sep. 17, 2009

(65) Prior Publication Data

US 2010/0226510 A1    Sep. 9, 2010

(30) Foreign Application Priority Data

Mar. 9, 2009  (JP) ................................. 2009-055384

(51) Int. Cl.
  *H03G 3/00*  (2006.01)
(52) U.S. Cl.
  USPC ............... 381/107; 381/103; 381/97; 84/616; 700/94
(58) Field of Classification Search
  USPC ........... 381/97, 101, 102, 103, 59, 57, 56, 58, 381/94.1, 104, 106, 107, 120, 303; 330/2, 330/3; 84/616, 622; 700/94
  See application file for complete search history.

(56) References Cited

U.S. PATENT DOCUMENTS

| 2001/0038702 | A1* | 11/2001 | Lavoie et al. | ................. 381/307 |
| 2003/0035549 | A1* | 2/2003 | Bizjak et al. | .................... 381/56 |
| 2009/0107322 | A1* | 4/2009 | Akiyama | ........................ 84/616 |

FOREIGN PATENT DOCUMENTS

| JP | 2002-345075 A | 11/2002 |
| JP | 2005-203981 A | 7/2005 |

OTHER PUBLICATIONS

Japanese Office Action dated May 31, 2011 (and English translation thereof) in counterpart Japanese Application No. 2009-055384.

\* cited by examiner

*Primary Examiner* — Vivian Chin
*Assistant Examiner* — Friedrich W Fahnert
(74) *Attorney, Agent, or Firm* — Holtz, Holtz, Goodman & Chick, PC

(57) ABSTRACT

A coefficient calculation unit calculates a coefficient (p) according to input signals (x[n]). A balance setting unit decides, according to this coefficient (p), a coefficient used to control the level of a signal in a digital level correction unit and a coefficient used to adjust the characteristics of a signal in a characteristic correction unit, thus allowing the digital level correction unit and characteristic correction unit to execute adaptive processing.

11 Claims, 7 Drawing Sheets

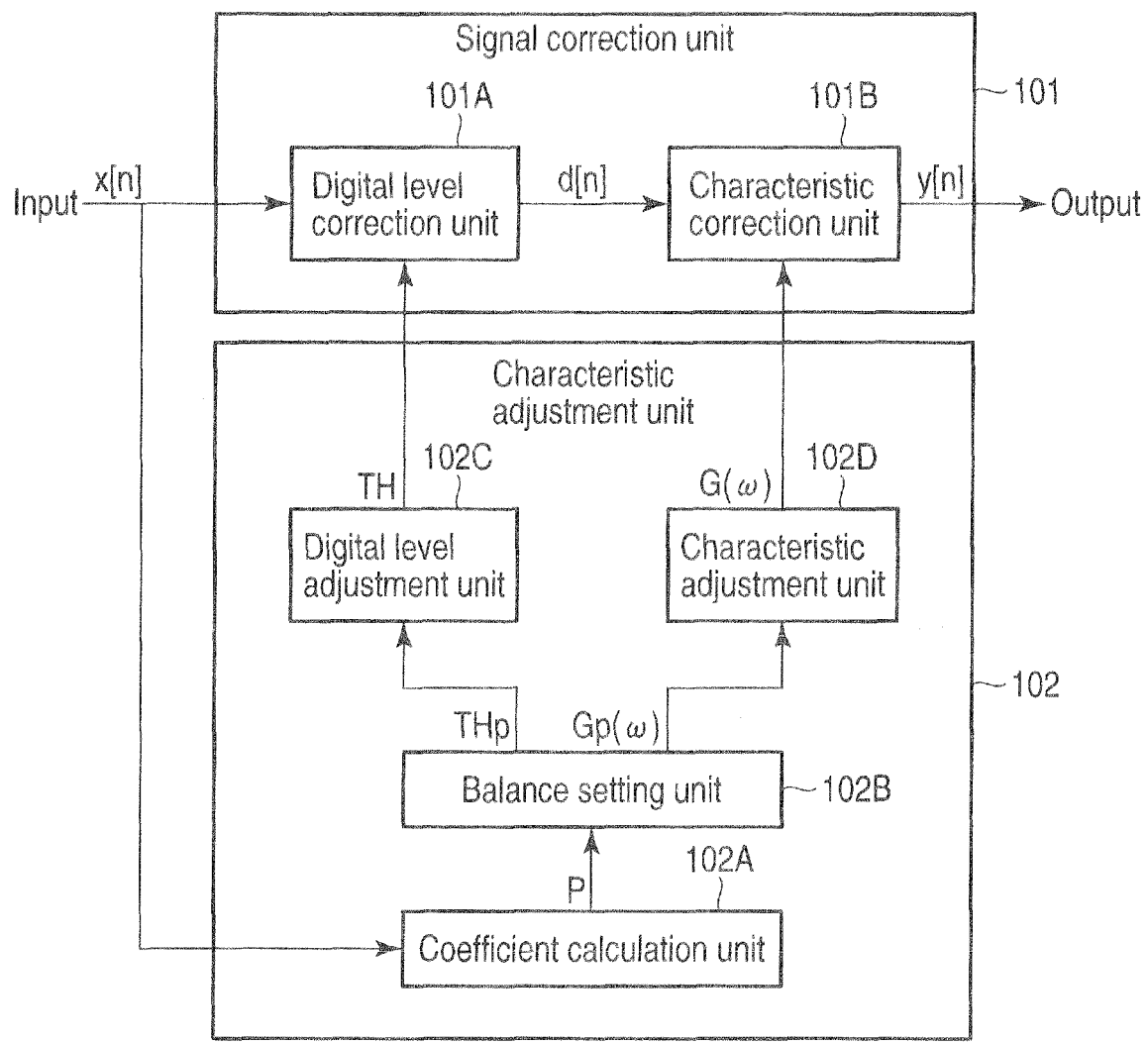
F I G. 1

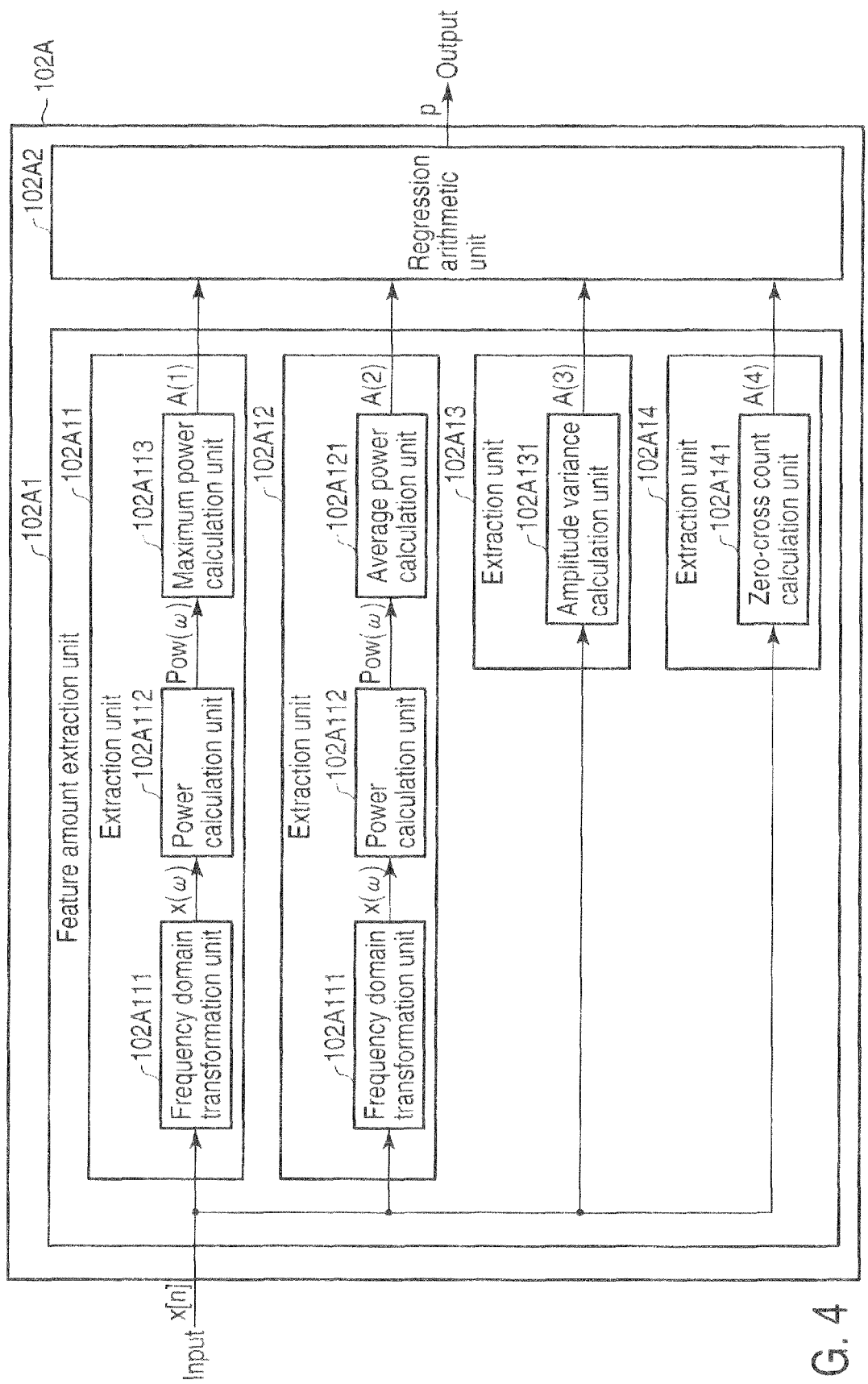
F I G. 4

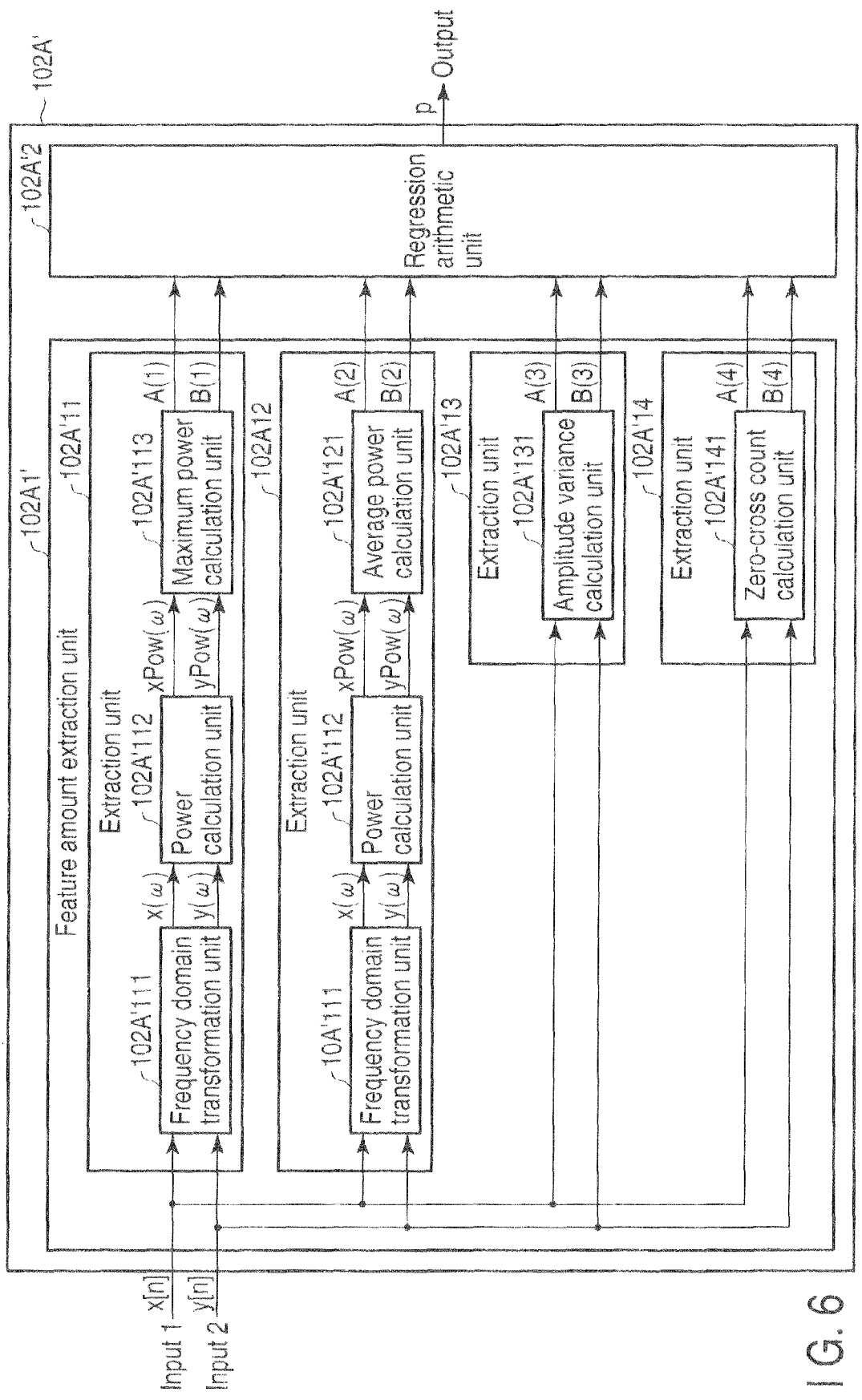
F I G. 6

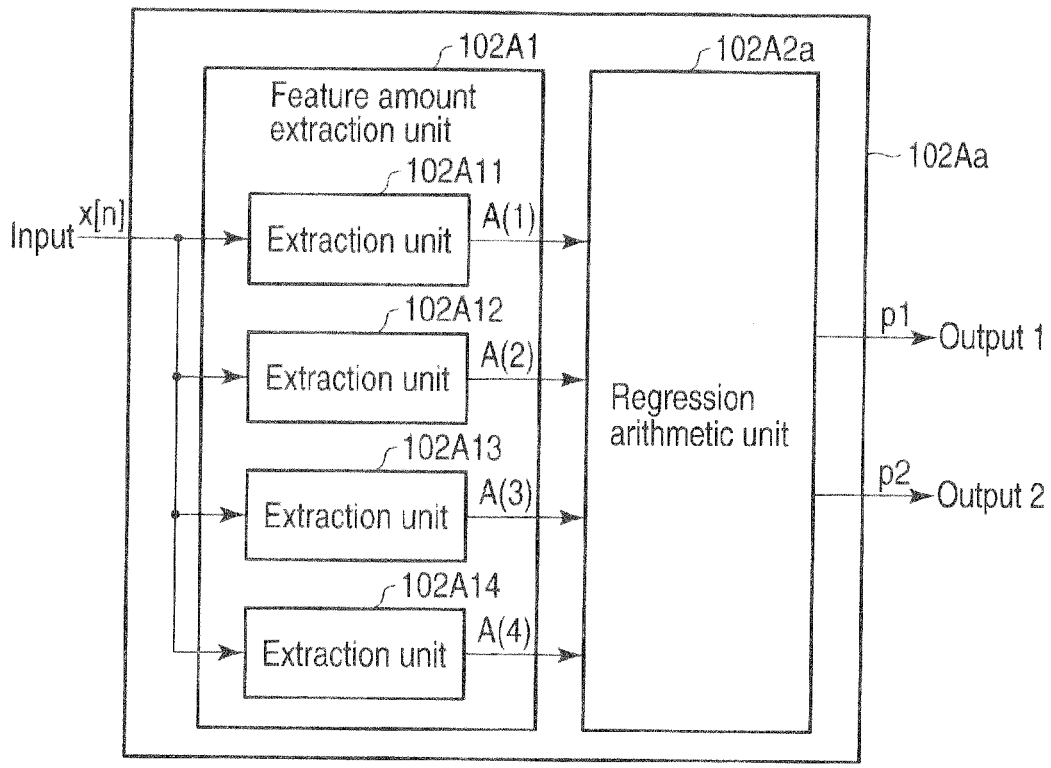
F I G. 8
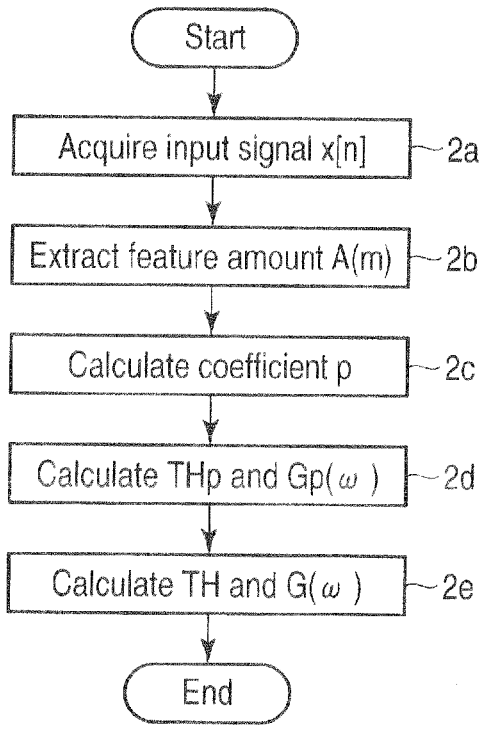
F I G. 9

SIGNAL CHARACTERISTIC ADJUSTMENT APPARATUS AND SIGNAL CHARACTERISTIC ADJUSTMENT METHOD

CROSS-REFERENCE TO RELATED APPLICATIONS

This application is based upon and claims the benefit of priority from prior Japanese Patent Application No. 2009-055384, filed Mar. 9, 2009, the entire contents of which are incorporated herein by reference.

BACKGROUND OF THE INVENTION

1. Field of the Invention

The present invention relates to a signal correction apparatus which adjusts the characteristics of an input signal.

2. Description of the Related Art

The development of a signal characteristic adjustment apparatus is in progress. This signal characteristic adjustment apparatus provides a desired listening environment (for example, indoor transfer characteristics, a head-related transfer function, and volume) by adjusting the characteristics (for example, volume, frequency characteristics, phase characteristics, and tone characteristics) of an input signal (for example, a speech or audio signal) using digital signal processor (DSP).

For example, an equalizer apparatus is available. This apparatus can adjust a level (for example, a power or signal amplitude) for each frequency band. Upon adjusting the level of a digital signal, when the level is raised, it may exceed a maximum level of a digital signal system, and that signal may be unwantedly clipped.

For this reason, the equalizer apparatus which raises the level of a digital signal executes level control for declining the level of an input signal over an entire frequency range, converts the input signal into an analog signal, and then amplifies the level of the analog signal by an amount declined in the processing of the digital signal.

Conventionally, in order to prevent deterioration of the signal-to-noise ratio due to raising/declining of the level, the level of an input digital signal is declined based on a maximum level change so as not to be clipped (for example, see Jpn. Pat. Appln. KOKAI Publication No. 2002-345075).

However, conventionally, since the level is declined only by a fixed amount, an excessive volume drop occurs depending on input signals.

The conventional signal characteristic adjustment apparatus declines the level of a digital signal so as to prevent the digital signal from being clipped. However, since the level is declined only by a fixed amount, an excessive volume drop may occur.

BRIEF SUMMARY OF THE INVENTION

The present invention has been made to solve the aforementioned problems, and has as its object to provide a signal characteristic adjustment apparatus which can prevent an excessive volume drop while preventing a digital signal from being clipped.

In order to achieve the above object, according to the present invention a signal characteristic adjustment apparatus, which adjusts characteristics of an input signal, comprising: a level control unit which controls a level of the input signal; a characteristic adjustment unit which adjusts characteristics of the input signal, the level of which is controlled by the level control unit; and a coefficient calculation unit which calculates a level control coefficient used to adjust level control of the level control unit and a characteristic adjustment coefficient used to adjust level control of the characteristic adjustment unit based on a feature quantity of the input signal.

As described above, according to the present invention, upon adjusting the characteristics of an input signal, the level of the input signal is controlled based on feature quantities of the input signal before adjustment. Therefore, according to the present invention, since adaptive processing suited to an input signal can be made, a signal characteristic adjustment apparatus and signal characteristic adjustment method, which can prevent a digital signal from being clipped while suppressing its excessive volume drop can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a block diagram showing the arrangement of a signal characteristic adjustment apparatus according to an embodiment of the present invention;

FIG. 4 is a block diagram showing an example of the arrangement of a coefficient calculation unit 102A of the signal characteristic adjustment apparatus according to the embodiment of the present invention;

FIG. 6 is a block diagram showing an example of the arrangement of a coefficient calculation unit 102A' of the signal characteristic adjustment apparatus according to the second embodiment of the present invention;

FIG. 8 is a block diagram showing an example of the arrangement of a coefficient calculation unit 102Aa of the signal characteristic adjustment apparatus according to the third embodiment of the present invention; and FIG. 9 is a flowchart for explaining the processing of a signal correction apparatus according to an embodiment of the present invention.

DETAILED DESCRIPTION OF THE INVENTION

Figure 2:
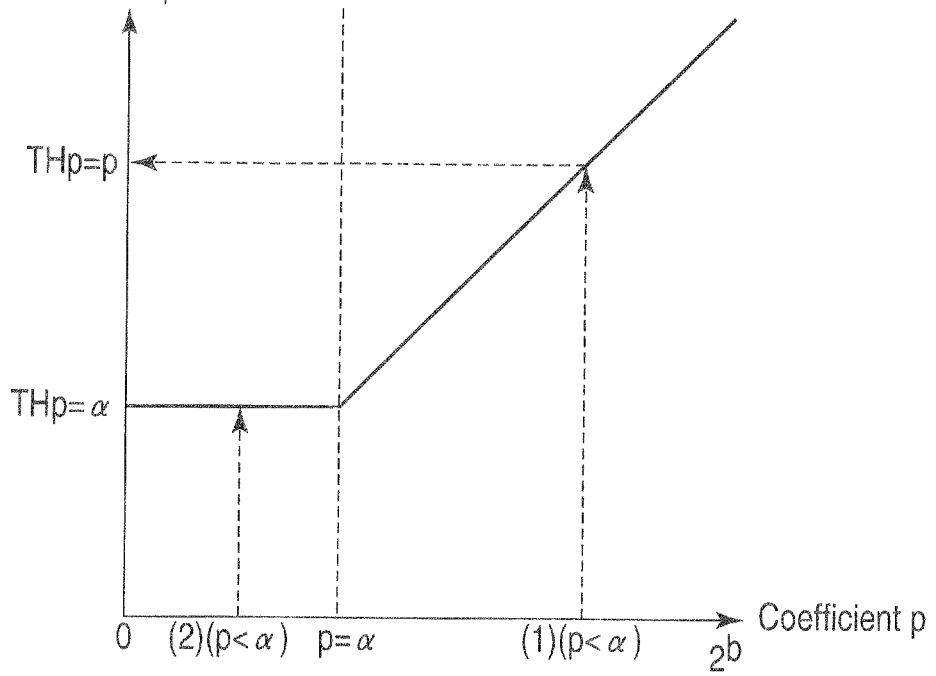
FIG. 2 is a graph showing an example of a provisional level control coefficient TH set by a balance setting unit of the signal characteristic adjustment apparatus according to the embodiment of the present invention.

Embodiments of the present invention will be described hereinafter with reference to the accompanying drawing.

First Embodiment

FIG. 1 shows the arrangement of a signal characteristic adjustment apparatus according to an embodiment of the present invention. This signal characteristic adjustment apparatus includes a signal correction unit 101 and characteristic adjustment unit 102. This signal characteristic adjustment apparatus is mounted in an electronic apparatus such as a speech communication apparatus (e.g., a cell phone) or a portable audio player, which converts a digital audio signal into an analog signal and outputs the analog signal.

For example, in case of the speech communication apparatus, a communication apparatus equipped in a stage before this circuit establishes a communication link with a communication apparatus as a communication partner to allow two-way speech communications with the communication partner. Reception data received by a wireless communication unit is decoded by a decoder (not shown) into a digital signal as input signals $x[n]$ ($n=1, 2, 3, \ldots, N$) for each predetermined processing time unit (one frame=N samples).

The input signal $x[n]$ may be either a speech or audio signal. In the following description, assume that the input signal $x[n]$ is a speech signal. As for the range of N, N may be an integer greater than or equal to 1, and the range corresponds to, for example, a frame size of N=160 samples. Note that in case of an audio signal, N mainly uses the powers of 2 such as 1024, 512, and 256.

Also, assume that the input signal $x[n]$ is a 16-bit signal. However, the present invention is not limited to this, and the input signal $x[n]$ may be a b-bit signal ($b=1, 2, 3, \ldots$) or a floating (floating point) signal. In the following description, the same condition applies to signals to be described later (for example, $d[n]$, $y[n]$, and the like in FIG. 1).

The signal correction unit 101 and characteristic adjustment unit 102 will be described below. The signal correction unit 101 receives the input signals $x[n]$ as inputs, and outputs output signals $y[n]$ ($n=1, 2, 3, \ldots, N$) obtained by adjusting the characteristics of the input signals.

The signal correction unit 101 includes a digital level correction unit 101A and characteristic correction unit 101B. The digital level correction unit 101A executes dynamic range control (DRC) of the input signals $x[n]$ using a level control coefficient TN input from the characteristic adjustment unit 102 (described later) to control the levels (for example, amplitude or power) of the signals, and outputs signals $d[n]$. More specifically, when the level of each input signal $x[n]$ is greater than the level control coefficient TH, the digital level correction unit 101A attenuates the level of the input signal $x[n]$ according to the level control coefficient TH, and outputs the attenuated signal.

On the other hand, when the level of each input signal $x[n]$ is less than the level control coefficient TH, the digital level correction unit 101A outputs the input signal $x[n]$ intact without changing its level. With the aforementioned control, only a large signal having a level which will cause clipping can be suppressed in advance. Note that the digital level correction unit 101A need only control the level of a signal, and may be implemented as automatic gain adjustment (AGC).

The characteristic correction unit 101B adjusts the frequency characteristics of the signals $d[h]$ using characteristic adjustment coefficients $G(\omega)$ input from the characteristic adjustment unit 102 (described later). This adjustment can compensate for a frequency band whose characteristics deteriorate of a cell phone handset loudspeaker, cell phone hand-free loudspeaker, or the like, or gives special effects such as indoor transfer characteristics and a head-related transfer function, thus realizing a desired listening environment.

More specifically, the characteristic correction unit 101B transforms the signals $d[n]$ into those of a frequency domain, and multiplies the transformed signals by the characteristic adjustment coefficients $G(\omega)$. The characteristic correction unit 101B then outputs signals obtained by transforming these products into signals of a time domain as the output signals $y[n]$. The output signals $y[n]$ are converted into an analog signal by a subsequent digital-to-analog converter (not shown), and the analog signal is amplified and output from a loudspeaker via an amplifier. Note that the characteristic correction unit 101B may adjust the frequency characteristics without transforming signals into those of the frequency domain.

In the description of this embodiment, the signal correction unit 101 controls the level of a signal. However, the signal correction unit 101 need only adjust the characteristics (for example, volume, frequency characteristics, phase characteristics, or tone characteristics) of a signal such as a speech or audio signal, and the present invention is not limited to the aforementioned arrangement.

The characteristic adjustment unit 102 receives the input signals $x[n]$ as inputs, and outputs the level control coefficient TH and characteristic adjustment coefficients $G(\omega)$ ($\omega=1, 2, 3, \ldots$) which are used to prevent clipping while suppressing an excessive volume drop of a signal for each frame. Note that the level control coefficient TH is a parameter which is used by the digital level correction unit 101A and is required to amplify or attenuate the level (for example, an amplitude or power) of a signal so as to attain desired volume settings. When each input signal $x[n]$ is a 16-bit speech signal, the level control coefficient TH falls within the range from 0 to $2^{16-1}$.

On the other hand, each characteristic adjustment coefficients $G(\omega)$ is a parameter which is used by the characteristic correction unit 101B and is required to adjust the frequency characteristics. $\omega$ indicates a frequency bin number, but it may indicate a grouped frequency band. These level control coefficient TH and characteristic adjustment coefficients $G(\omega)$ are output for each frame. For this reason, the signal correction unit 101 can execute adaptive processing suited to input signals, and can prevent clipping while suppressing an excessive volume drop of a signal.

The characteristic adjustment unit 102 includes a coefficient calculation unit 102A, balance setting unit 102B, digital level adjustment unit 102C, and characteristic adjustment unit 102D. The respective units will be described below.

The coefficient calculation unit 102A receives the input signals $x[n]$ as inputs, and outputs a threshold of a minimum level control coefficient required to prevent clipping as a coefficient p. The coefficient p is calculated based on an equation of square error minimum reference which is prepared by executing, in advance, regression analysis of the feature quantities (for example, an absolute spectral power, average spectral power, average spectral variance, spectral power standard deviation, average amplitude, maximum amplitude, zero-crossing count, amplitude variance, amplitude standard deviation, inter-sample amplitude difference variance, inter-sample amplitude difference standard deviation, and so forth), and the threshold of the minimum level control coefficient required to prevent clipping.

As a result, since the adaptive processing suited to input signals for each frame can calculate the coefficient p, clipping can be prevented while suppressing an excessive volume drop of a signal. A practical arrangement example of the coefficient calculation unit 102A will be described in detail later.

The balance setting unit 102B receives the coefficient p as an input, and makes a conditional evaluation so as to prevent speech quality deterioration (for example, distortions caused by the level control, an unnatural volume caused by the automatic volume control, noise, and the like). The balance setting unit 102B outputs a provisional level control coefficient $TH_p$ and provisional characteristic adjustment coefficients $G_p(\omega)$ based on the conditional evaluation result.

Note that the conditional evaluation is to compare a value which is set in advance as a minimum level control coefficient TH (minimum level control coefficient α) with the coefficient p. Note that this minimum level control coefficient α is set to prevent speech quality deterioration due to the level control of a signal. Since the provisional level control coefficient $TH_p$ and provisional characteristic adjustment coefficients $G_p(\omega)$ are calculated based on the comparison result between the minimum level control coefficient α and the coefficient p, clipping can be prevented while suppressing speech quality deterioration caused by the level control and an excessive volume drop.

A practical operation of the balance setting unit 102B will be described below. The balance setting unit 102B compares the coefficient p and minimum level control coefficient α. When the coefficient p is greater than the minimum level control coefficient α (α<p), since this means that the level control does not cause any speech deterioration, the balance setting unit 102B outputs the coefficient p as the provisional level correction coefficient $TH_p$ intact, and outputs provisional characteristic adjustment coefficients $G_1(\omega)$ one frame before as the provisional characteristic adjustment coefficients $G_p(\omega)$.

Note that the provisional characteristic adjustment coefficients $G_1(\omega)$ one frame before are the provisional characteristic adjustment coefficients $G_p(\omega)$ which were calculated one frame before the current frame. Note that the provisional characteristic adjustment coefficients $G_1(\omega)$ one frame before need only be information used to adjust the characteristics one frame before the current frame, and may be, for example, characteristic adjustment coefficients $G(\omega)$ calculated one frame before the current frame.

On the other hand, when the coefficient p is less than the minimum level control coefficient α (α>p), since this means that the level control causes speech deterioration, the balance setting unit 102B outputs the minimum level control coefficient α as the provisional level correction coefficient $TH_p$. Also, the balance setting unit 102B suppresses the amplification and attenuation levels of the provisional characteristic adjustment coefficients $G_1(\omega)$ one frame before, as given by:

$$G_p(\omega) = G_1(\omega) - \left(1 - \frac{\beta \cdot p}{\alpha}\right)(G_1(\omega) - 1) \quad (1)$$

and outputs the provisional characteristic adjustment coefficients $G_1(\omega)$ one frame before, the levels of which are suppressed, as the provisional characteristic adjustment coefficients $G_p(\omega)$.

Note that β in Equation 1 is a parameter used to weight a suppression effect of the amplification and attenuation levels of the provisional characteristic adjustment coefficients $G_p(\omega)$, and β≤1. When the minimum level control coefficient α is much greater than the balance control coefficient p (α>>p), the amplification and attenuation levels of the provisional characteristic adjustment coefficients $G_p(\omega)$ are largely suppressed to apply processing that nearly does not change the characteristics. When the minimum level control coefficient α is equal to the coefficient p, the correction coefficients $TH_p$ and $G_p(\omega)$ may be determined based on either of the aforementioned conditions.

FIG. 2 is a graph showing an example of the provisional level control coefficient $TH_p$ set by the balance setting unit 102B. When the coefficient p is greater than the minimum level control coefficient α (1) (α<p), the provisional level control coefficient $TH_p$ is decided based on the coefficient p. Note that the provisional level control coefficient $TH_p$ need only be calculated based on the coefficient p, and may not be output as the coefficient p intact.

On the other hand, when the coefficient p is less than the minimum level control coefficient α(2)(α>p), the provisional level control coefficient $TH_p$ is decided based on the minimum level control coefficient α. Note that the provisional level control coefficient $TH_p$ need only be calculated based on the minimum level control coefficient α, and may not be output as the minimum level control coefficient α intact.

Figure 3:
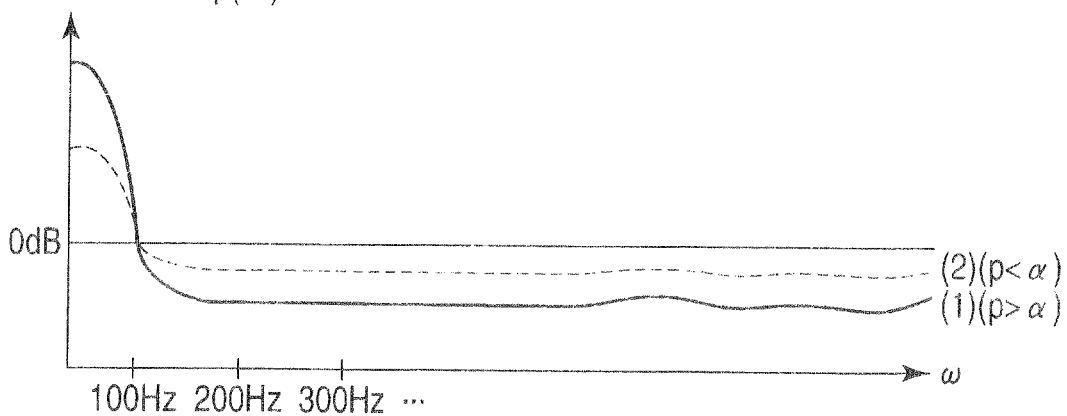
FIG. 3 is a graph showing an example of provisional characteristic adjustment coefficients $G_p(\omega)$ set by the balance setting unit of the signal characteristic adjustment apparatus according to the embodiment of the present invention.

FIG. 3 is a graph showing an example of the provisional characteristic adjustment coefficients $G_p(\omega)$ set by the balance setting unit 102B. When the coefficient p is greater than the minimum level control coefficient α(1) (α<p), the provisional characteristic adjustment coefficients $G_p(\omega)$ are decided based on the provisional characteristic adjustment coefficients $G_1(\omega)$ one frame before.

Note that the provisional characteristic adjustment coefficients $G_p(\omega)$ need only be calculated based on the provisional characteristic adjustment coefficients $G_1(\omega)$ one frame before, and they may not be output as the provisional characteristic adjustment coefficients $G_1(\omega)$ one frame before intact.

On the other hand, when the coefficient p is less than the minimum level control coefficient α(2) (α>p), the provisional characteristic adjustment coefficients $G_p(\omega)$ are output after suppressing the amplification and attenuation levels of the provisional characteristic adjustment coefficients $G_1(\omega)$ one frame before. Note that the provisional characteristic adjustment coefficients $G_p(\omega)$ need only be output by suppressing the amplification and attenuation levels of the provisional characteristic adjustment coefficients $G_1(\omega)$ one frame before, and are not limited to Equation 1.

The digital level adjustment unit 102C receives the provisional level control coefficient $TH_p$ as an input, and suppresses transient influences between neighboring frames. More specifically, the digital level adjustment unit 102C applies smoothing processing to the provisional level control coefficients $TH_p$ between neighboring frames using:

$$TH = \text{smooth}(TH_R, \ldots TH_2, TH_1, TH_p) \quad (2)$$

$$= \frac{\sum_{j=1}^{R} \varphi R_j \cdot TH_j + \varphi p \cdot TH_p}{\sum_{j=1}^{R} \varphi R_j + \varphi p}$$

and outputs the smoothed value to the digital level correction unit 101A as the level control coefficient TH. More specifically, the digital level adjustment unit 102C calculates the level control coefficient TH by smoothing the provisional level control coefficients $TH_p$ according to Equation 2 so as to suppress transient influences between neighboring frames with respect to the R-th and subsequent frames, and outputs the calculated level control coefficient TH.

Note that the digital level correction unit 101A outputs a level control coefficient $TH_0$ from the beginning of speech communication until the R-th frame (R≥1). $TH_0$ is the level control coefficient TH which was set in the digital level correction unit 101A in advance before the beginning of speech communication. In Equation 2, $TH_R$ is the level control coefficient TH calculated R frames before. However, $TH_R$ need only be information used to control the signal level R frames before and, for example, it may be the provisional level control coefficient $TH_p$ R frames before.

Also, $\phi R_j$ and $\phi p$ are smoothing coefficients, which allow to change the weights for the smoothing processing. Note that the digital level adjustment unit 102C is not limited to the aforementioned example as long as it suppresses transient influences between neighboring frames.

The characteristic adjustment unit 102D receives the provisional characteristic adjustment coefficients $G_p(\omega)$ as inputs, applies smoothing processing to the provisional characteristic adjustment coefficients $G_p(\omega)$ between neighboring frames, and outputs the characteristic adjustment coefficients $G(\omega)$ to be set in the characteristic correction unit 101B. More specifically, in order to suppress transient influences between neighboring frames with respect to the R-th and subsequent frames, the characteristic adjustment unit 102D calculates the characteristic adjustment coefficients $G(\omega)$ by smoothing the provisional characteristic adjustment coefficients $G_p(\omega)$ according to:

$$G(\omega) = \text{smooth}(G_R(\omega), \ldots G_2(\omega), G_1(\omega), G_p(\omega)) \quad (3)$$

$$= \frac{\sum_{j=1}^{R} \varphi R_j \cdot G_j(\omega) + \varphi p \cdot G_p(\omega)}{\sum_{j=1}^{R} \varphi R_j + \varphi p}$$

and outputs the calculated characteristic adjustment coefficients $G(\omega)$.

Note that the characteristic correction unit 101B outputs characteristic adjustment coefficients $G_0(\omega)$ from the beginning of speech communication until the R-th frame (R≥1). Coefficients $G_0(\omega)$ are the characteristic adjustment coefficients $G(\omega)$ which were set in the characteristic correction unit 101B in advance before the beginning of speech communication.

In Equation 3, provisional characteristic adjustment coefficients $G_R(\omega)$ are characteristic adjustment coefficients $G(\omega)$ which were calculated R frames before. However, the characteristic adjustment coefficients $G_R(\omega)$ need only be information used to adjust the characteristics of a signal R frames before, and may also be the provisional characteristic adjustment coefficients $G_p(\omega)$ R frames before.

Also, $\phi R_j$ and $\phi p$ are smoothing coefficients, which allow to change the weights for the smoothing processing. These smoothing coefficients may not be the same as those in the digital level adjustment unit 102C. Note that the characteristic adjustment unit 102D is not limited to the aforementioned example, as long as it suppresses transient influences between neighboring frames.

FIG. 4 shows an arrangement example of the coefficient calculation unit 102A. The coefficient calculation unit 102A includes a feature quantity extraction unit 102A1 and regression arithmetic unit 102A2. Furthermore, the feature quantity extraction unit 102A1 includes extraction units 102A11 to 102A14. Respective units will be described below.

The feature quantity extraction unit 102A1 receives the input signals x[n] as inputs, extracts a plurality of feature quantities (for example, an absolute spectral power, average spectral power, average spectral variance, spectral power standard deviation, average amplitude, maximum amplitude, zero-crossing count, amplitude variance, amplitude standard deviation, inter-sample amplitude difference variance, inter-sample amplitude difference standard deviation, and so forth) for each frame, and outputs feature quantities A(m) (m=1, 2, 3, . . . S) (S≥1). In the following description, the feature quantity extraction unit 102A1 extracts four feature quantities, but it may extract one or more feature quantities.

The extraction unit 102A11 receives the input signals x[n] as inputs, and transforms the input signals x[n] from signals of a time domain into those of a frequency domain. The extraction unit 102A11 calculates spectral powers for respective frequency bins, calculates a spectral power which is maximum of those of frequency band ω (maximum spectral power), and outputs it as a feature quantity A(1). The extraction unit 102A11 includes a frequency domain transformation unit 102A111, power calculation unit 102A112, and maximum power calculation unit 102A113.

The frequency domain transformation unit 102A111 receives the input signals x[n] as inputs, transforms the input signals x[n] from signals of the time domain into signals X(ω) of the frequency domain by, for example, an arithmetic operation such as fast Fourier transformation (FFT), and outputs the transformed signals.

Note that the frequency domain transformation unit 102A111 may alternatively use other orthogonal transformations represented by discrete Fourier transformation (DFT), discrete cosine transformation (DCT), Walsh-Hadamard transformation (WHT), Harr transformation (HT), slant transformation (SLT), and Karhunen-Loeve transformation (KLT), which transform signals into those of the frequency domain.

More specifically, assume that the input signals x[n] (n=1, 2, 3, . . . , N) are n samples of input signals of the time domain, and let N be the degree of the FFT. Then, the signals X(ω) (ω=1, 2, 3, . . . , N) of the frequency domain have N frequency bins. Note that signals to which the FFT is applied may overlap signals of the previous frame or may be zero-padded to convert the data length to the power of 2, thus setting the degree N of the FFT to be the power of 2.

The power calculation unit 102A112 receives the frequency domain signals X(ω) as inputs, calculates spectral powers for respective frequency bins, and outputs them as spectral powers pow(ω) (ω=1, 2, 3, . . . , N). The power calculation unit 102A112 calculates the spectral powers of the input signals for respective frequency bins according to:

$$\text{pow}(\omega) = |X(\omega)|^2 \quad (4)$$

However, the output of the power calculation unit 102A112 may not be the square of X(ω). Alternatively, using signals R frames (R being an integer) before the current frame, spectral powers may be calculated using the average spectral power pow(ω), as given by:

$$\text{pow}(\omega) = \frac{\sum_{i=1}^{R} |X_i(\omega)|^2}{R} \quad (5)$$

Using the average spectral power in this way, transient influences between neighboring frames can be suppressed. Note that $X_i(\omega)$ in Equation 5 is a frequency domain signal X(ω) i frames (i=1, 2, 3, . . . , R) before the current frame. Also, each spectral power pow(ω) may be weighted by multiplying it by the characteristic adjustment coefficient $G_0(\omega)$, as given by:

$$pow(\omega) = G_0(\omega) \times pow(\omega) \quad (6)$$

By weighting the spectral powers in this way, a more ideal coefficient p can be calculated. Note that the spectral powers need only be calculated from the frequency domain signals X(ω), and the present invention is not limited to the aforementioned configuration.

The maximum power calculation unit 102A113 receives the spectral powers pow(ω) as inputs, detects a maximum spectral power pow_MAX from the spectral powers of all the frequency bins, and outputs it as the feature quantity A(1).

Alternatively, the maximum power calculation unit 102A113 may output, as the feature quantity A(1), a value obtained by normalizing the spectral power pow_MAX by the sum total of spectral powers of all the frequency bins according to:

$$A(1) = \frac{pow\_MAX}{\sum_{\omega=1}^{N} pow(\omega)} \quad (7)$$

In Equation 7, A(1) assumes a value less than or equal to 1 (A(1)≤1), and when A(1) is closer to this means that a spectral power is concentrated on a specific frequency bin. If the characteristics are to be adjusted to amplify a specific frequency bin, whether or not clipping occurs can be determined in advance based on the feature quantity A(1) given by Equation 7. Note that the maximum power calculation unit 102A113 is not limited to the above example as long as it calculates a maximum spectral power of spectral powers of all the frequency bins.

The extraction unit 102A12 receives the input signal x[n] as inputs, and transforms the input signals x[n] from signals of the time domain into those of the frequency domain. The extraction unit 102A12 calculates spectral powers for respective frequency bins, calculates the average (average spectral power) of these spectral powers, and outputs it as a feature quantity A(2). The extraction unit 102A12 includes a frequency domain transformation unit 102A111, power calculation unit 102A112, and average power calculation unit 102A121.

The average power calculation unit 102A121 receives the spectral powers pow(ω) as inputs, detects the average pow_AVG (average spectral power) of the spectral powers for respective frequency bins, and outputs it as the feature quantity A(2). More specifically, the average power calculation unit 102A121 calculates the feature quantity A(2) according to:

$$A(2) = pow\_AVG \quad (8)$$

$$= \frac{\sum_{\omega=1}^{N} pow(\omega)}{N}$$

The extraction unit 102A13 receives the input signals x[n] as inputs, calculate the amplitude variance, and outputs it as a feature quantity A(3). The extraction unit 102A13 includes an amplitude variance calculation unit. 102A131. The amplitude variance calculation unit 102A131 receives the input signals x[n] as inputs, calculates the amplitude variance, and outputs it as the feature quantity A(3). More specifically, the amplitude variance calculation unit 102A131 calculates the feature quantity A(3) according to:

$$A(3) = \frac{\sum_{n=1}^{N} |x[n] - \text{mean}|^2}{N} \quad (9)$$

where "mean" is the mean value of x[n].

The extraction unit 102A14 receives the input signals x[n] as inputs, calculates a zero-crossing count, and outputs it as a feature quantity A(4). The extraction unit 102A14 includes a zero-crossing count calculation unit 102A141.

The zero-crossing count calculation unit 102A141 receives the input signals x[n] as inputs, counts a zero-crossing count (a case of x[n]=0 and a case in which the sign of x[n] is inverted), and outputs it as a feature quantity A(4). Since the zero-crossing count is used in determination of, e.g., voiced speech/unvoiced speech, clipping can be prevented while suppressing an excessive volume drop of a signal depending on voiced speech or unvoiced speech.

The regression arithmetic unit 102A2 calculates the threshold of the minimum level control coefficient required to prevent clipping from the feature quantities. For example, the regression arithmetic unit 102A2 receives the feature quantities A(m) (m=1, 2, 3, 4) as inputs, and outputs the coefficient p based on an equation of square error minimum reference prepared by executing, in advance, regression analysis of the threshold and feature quantities, like Equation 10:

$$p = \sum_{m=1}^{4} \zeta(m) \cdot A(m) \quad (10)$$

In Equation 10, ζ(m) (m=1, 2, 3, 4) is coefficient obtained by the regression analysis of the threshold of the minimum level control coefficient required to prevent clipping and the feature quantities A(m), and can be set in advance. If the correlation between the threshold of the minimum level control coefficient required to prevent clipping and the feature quantities A(m) is high, a more ideal coefficient p can be calculated.

As described above, in the signal characteristic adjustment apparatus with the above arrangement, the coefficient calculation unit 102A calculates the coefficient p according to the input signals x[n], and the balance setting unit 102B decides, from the calculated coefficient p, the coefficient used to control the level of a signal in the digital level correction unit 101A, and the coefficient used to adjust the characteristics of a signal in the characteristic correction unit 101B. Therefore, according to the signal characteristic adjustment apparatus with the above arrangement, the digital level correction unit 101A and characteristic correction unit 101B can execute adaptive processing according to the coefficient p of the input signals x[n], thus preventing an excessive volume drop while preventing a digital signal from being clipped.

Second Embodiment

Figure 5:
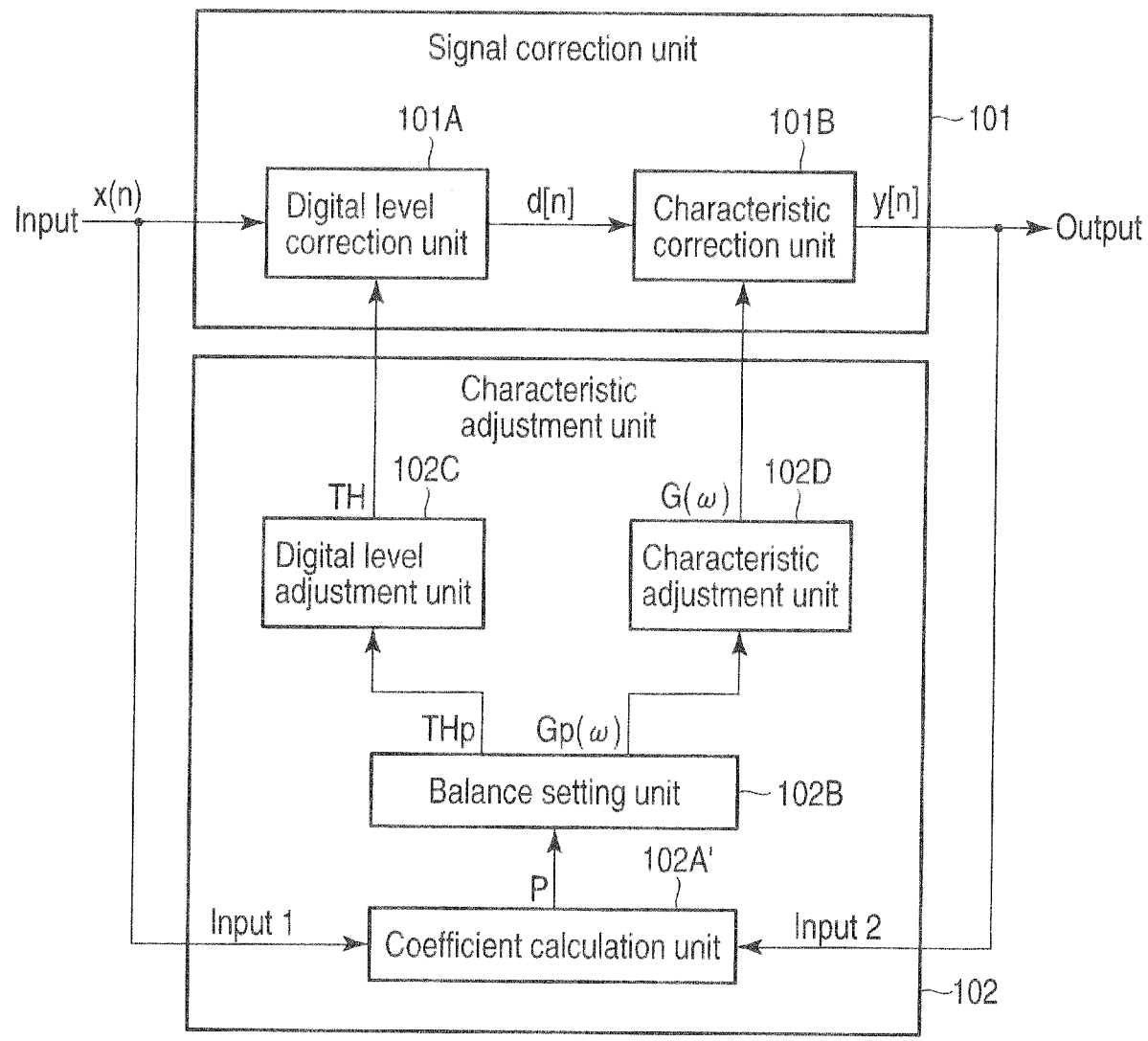
FIG. 5 is a block diagram showing the arrangement of a signal characteristic adjustment apparatus according to the second embodiment of the present invention.

The second embodiment according to the present invention will be described below. FIG. 5 shows the arrangement of the second embodiment. In the following description, the same reference numbers denote the same components as in the aforementioned first embodiment, and a repetitive description thereof will be avoided as needed for simplicity.

A characteristic adjustment unit 102 according to the second embodiment receives, as inputs, output signals y[n] obtained by adjusting the characteristics of signals in addition to input signals x[n], and outputs a level control coefficient TH and characteristic adjustment coefficients G(ω) (ω=1, 2, 3, ... ) which are required to prevent clipping while suppressing an excessive volume drop of a signal for each frame. The characteristic adjustment unit 102 according to the second embodiment uses a coefficient calculation unit 102A' in place of the coefficient calculation unit 102A used in the characteristic adjustment unit 102 according to the first embodiment.

The coefficient calculation unit 102A' receives, as inputs, the output signals y[n] obtained by adjusting the characteristics of signals in addition to the input signals x[n], and outputs a threshold of a minimum level control coefficient required to prevent clipping as a coefficient p. As shown in FIG. 6, the coefficient calculation unit 102A' includes a feature quantity extraction unit 102A'1 and regression arithmetic unit 102A'2.

The feature quantity extraction unit 102A'1 includes extraction units 102A'11, 102A'12, 102A'13, and 102A'14. The feature quantity extraction unit 102A'1 receives, as inputs, the output signals y[n] obtained by adjusting the characteristics of signals in addition to the input signals x[n], extracts a plurality of feature quantities for each frame, and outputs feature quantities A(m) and B(m) (m=1, 2, 3, 4).

In the following description, the feature quantity extraction unit 102A'1 extracts four feature quantities. However, one or more types of feature quantities including an absolute spectral power, average spectral power, average spectral variance, spectral power standard deviation, average amplitude, maximum amplitude, zero-crossing count, amplitude variance, amplitude standard deviation, inter-sample amplitude difference variance, inter-sample amplitude difference standard deviation, and so forth need only be calculated.

The extraction unit 102A'11 receives, as inputs, the input signals x[n] and the output signals y[n] obtained by changing the characteristics of signals, and transforms those signals from signals of a time domain into those of a frequency domain. The extraction unit 102A'11 calculates spectral powers for respective frequency bins, calculates spectral powers which are maximum of those of frequency bins ω (maximum spectral powers), and outputs them as feature quantities A(1) and B(1). The extraction unit 102A'11 includes a frequency domain transformation unit 102A'111, power calculation unit 102A'112, and maximum power calculation unit 102A'113.

The frequency domain transformation unit 102A'111 receives, as inputs, the output signals y[n] obtained by adjusting the characteristics of signals in addition to the input signals x[n]. The frequency domain transformation unit 102A'111 transforms the input signals x[n] from signals of the time domain into signals X(ω) of the frequency domain and transforms the output signals y[n] from signals of the time domain into signals Y(ω) of the frequency domain by, for example, an arithmetic operation such as fast Fourier transformation (FFT).

The power calculation unit 102A'112 receives, as inputs, the frequency domain signals Y(ω) in addition to the frequency domain signals X(ω), calculates spectral powers for respective frequency bins, and outputs them as spectral powers xpow(ω) and ypow(ω) (ω=1, 2, 3, . . . , N). The power calculation unit 102A'112 calculates the spectral powers of the input signals for respective frequency bins according to:

$$xpow(\omega) = |X(\omega)|^2 \tag{11}$$

$$ypow(\omega) = |Y(\omega)|^2 \tag{12}$$

The maximum power calculation unit 102A'113 receives, as inputs, the spectral powers xpow(ω) and ypow(ω), detects maximum spectral powers xpow_MAX and ypow_MAX from the spectral powers of all the frequency bins, and outputs them as the feature quantities A(1) and B(1).

The extraction unit 102A'12 receives, as inputs, the input signal x[n] and the output signals y[n] obtained by adjusting the characteristics of signals, and transforms those signals from signals of the time domain into those of the frequency domain. The extraction unit 102A'12 calculates spectral powers for respective frequency bins, calculates averages (average spectral powers) of these spectral powers, and outputs them as feature quantities A(2) and B(2). The extraction unit 102A'12 includes a frequency domain transformation unit 102A'111, power calculation unit 102A'112, and average power calculation unit 102A'121.

The average power calculation unit 102A'121 receives, as inputs, the spectral powers xpow(ω) and ypow(ω), detects averages xpow_AVG and ypow_AVG (average spectral powers) of the spectral powers for respective frequency bins, and outputs them as the feature quantities A(2) and B(2). More specifically, the average power calculation unit 102A'121 calculates the feature quantities A(2) and B(2) according to:

$$A(2) = xpow\_AVG = \frac{\sum_{\omega=1}^{N} xpow(\omega)}{N} \tag{13}$$

$$B(2) = ypow\_AVG = \frac{\sum_{\omega=1}^{N} ypow(\omega)}{N} \tag{14}$$

The extraction unit 102A'13 receives, as inputs, the input signals x[n] and the output signals y[n] obtained by adjusting the characteristics of signals, calculates amplitude variances, and outputs them as feature quantities A(3) and B(3). The extraction unit 102A'13 includes an amplitude variance calculation unit 102A'131. The amplitude variance calculation unit 102A'131 receives, as inputs, the output signals y[n] obtained by adjusting the characteristics of signals in addition to the input, signals x[n], calculates amplitude variances, and outputs them as the feature quantities A(3) and B(3).

More specifically, the amplitude variance calculation unit 102A'131 calculates the feature quantities A(3) and B(3) according to:

$$A(3) = \frac{\sum_{n=1}^{N} |x[n] - xmean|^2}{N} \tag{15}$$

$$B(3) = \frac{\sum_{n=1}^{N} |y[n] - ymean|^2}{N} \tag{16}$$

Note that "xmean" in Equation 15 is the mean value of x[n], and "ymean" in Equation 16 is the mean value of y[n].

The extraction unit 102A'14 receives, as inputs, the output signals y[n] obtained by adjusting the characteristics of signals in addition to the input signals x[n], calculates zero-crossing counts, and outputs them as feature quantities A(4)

and B(4). The extraction unit 102A'14 includes a zero-crossing count calculation unit 102A'141.

The zero-crossing count calculation unit 102A'141 receives, as inputs, the output signals y[n] obtained by adjusting the characteristics of signals in addition to the input signals x[n], counts zero-crossing points (a case of x[n]=0 and y[n]=0, and a case in which the sign of x[n] and y[n] is inverted), and outputs them as feature quantities A(4) and B(4). Since the zero-crossing count is used in determination of, e.g., voiced speech/unvoiced speech, clipping can be prevented while suppressing an excessive volume drop of a signal depending on voiced speech or unvoiced speech.

The regression arithmetic unit 102A'2 receives the feature quantities A(m) and B(m) (m=1, 2, 3, 4) as inputs, and outputs the coefficient p based on an equation of square error minimum reference prepared by executing, in advance, regression analysis of these feature quantities. More specifically, the regression arithmetic unit 102A'2 calculates the coefficient p using:

$$p = \sum_{m=1}^{S} (\zeta'(m) \cdot A(m) + \xi'(m) \cdot B(m)) \tag{17}$$

In Equation 17, $\zeta'(m)$ and $\xi'(m)$ (m=1, 2, 3, . . . , S) are coefficients obtained by executing, in advance, the regression analysis of the threshold of the minimum level control coefficient required to prevent clipping and the feature quantities A(m) and B(m), and can be set in advance. Since the feature quantities B(m) are those of the output signals obtained by adjusting the characteristics of signals, whether or not signals are clipped is easily determined. This means that the correlation with the threshold of the minimum level control coefficient required to prevent clipping is high, and an ideal coefficient p can be calculated.

With this arrangement as well, the same effects as in the first embodiment can be obtained. Also, according to this arrangement, since the feature quantities B(m) are used, whether or not signals are clipped is easily determined. Since the correlation with the threshold of the minimum level control coefficient required to prevent clipping is high, more ideal coefficient p can be calculated. That is, since the digital level correction unit 101A and characteristic correction unit 101B can execute adaptive processing with higher precision according to this coefficient p, an excessive volume drop can be prevented while effectively preventing a digital signal from being clipped.

Third Embodiment

Figure 7:
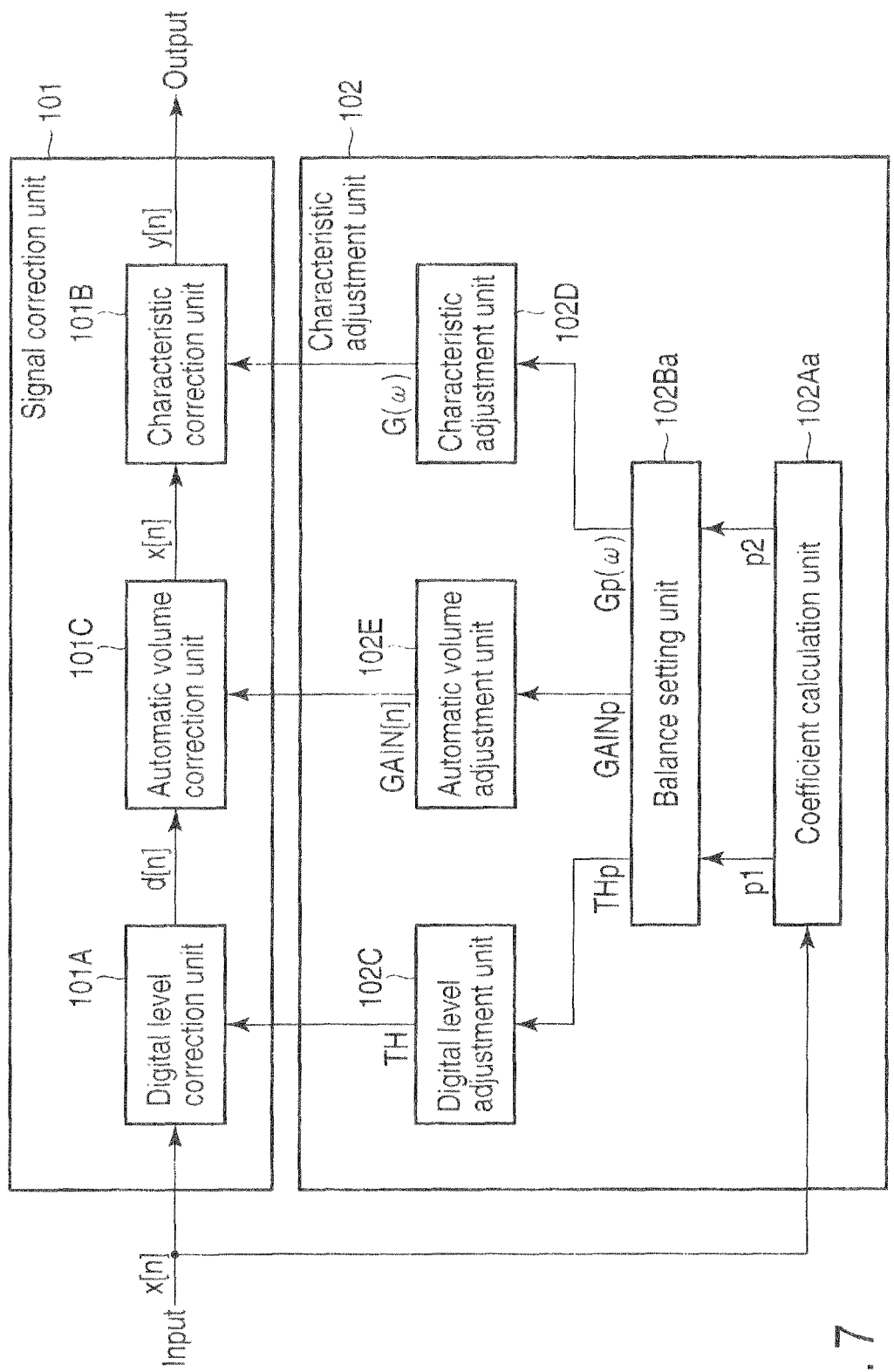
FIG. 7 is a block diagram showing the arrangement of a signal characteristic adjustment apparatus according to the third embodiment of the present invention.

The third embodiment according to the present invention will be described below. FIG. 7 shows the arrangement of the third embodiment. In the following description, the same reference numbers denote the same components as in the aforementioned embodiments, and a repetitive description thereof will be avoided as needed for simplicity.

As shown in FIG. 7, a signal correction unit 101 of the third embodiment includes an automatic volume correction unit 101C in addition to a digital level correction unit 101A and characteristic correction unit 101B. In the following description, the automatic volume correction unit 101C is arranged after the digital level correction unit 101A, but it may be arranged before the digital level correction unit 101A or after the characteristic correction unit 101B.

The automatic volume correction unit 101C receives signals d[n] as inputs, executes automatic volume control, and outputs the controlled signals as signals z[n]. The volume to be automatically set is decided based on volume control coefficients GAIN[n] (described in detail later) output from a characteristic adjustment unit 102 (described later). That is, the automatic volume correction unit 101C amplifies or attenuates the signals d[n] according to the volume control coefficients GAIN[n] to obtain the output signals z[n] (z[n]=GAIN[n]·d[n]). In this way, the volume can be automatically adjusted to an appropriate speech pressure (one that feels comfortable).

The characteristic adjustment unit 102 uses a coefficient calculation unit 102A$a$ in place of the coefficient calculation unit 102A used in the characteristic adjustment unit 102 described in the above embodiment. Also, the characteristic adjustment unit 102 uses a balance setting unit 102B$a$ in place of the balance setting unit 102B. Furthermore, the characteristic adjustment unit 102 uses an automatic volume adjustment unit 102E.

As shown in FIG. 8, the coefficient calculation unit 102A$a$ receives input signals x[n] as inputs, outputs a threshold of a minimum level control coefficient required to prevent clipping as a coefficient p1, and also outputs a coefficient used to attain automatic volume control as a coefficient p2. The coefficient calculation unit 102A$a$ includes a feature quantity extraction unit 102A and regression arithmetic unit 102A2$a$.

The regression arithmetic unit 102A2$a$ receives feature quantities A(m) (m=1, 2, 3, 4) as inputs, and outputs the coefficients p1 and p2 based on equations of square error minimum reference prepared by executing, in advance, regression analysis of the feature quantities. More specifically, the regression arithmetic unit 102A2$a$ calculates the coefficients p1 and p2 using:

$$p1 = \sum_{m=1}^{4} \zeta a(m) \cdot A(m) \tag{18}$$

$$p2 = \sum_{m=1}^{4} \xi a(m) \cdot A(m) \tag{19}$$

In Equation 18, $\zeta a(m)$ (m=1, 2, 3, 4) is a coefficient obtained by executing, in advance, the regression analysis of the threshold of the minimum level control coefficient required to prevent clipping and the feature quantities A(m), and can be set in advance.

In Equation 19, $\xi a(m)$ (m=1, 2, 3, 4) is a coefficient obtained by executing, in advance, the regression analysis of a coefficient used to automatically adjust to an appropriate speech pressure and the feature quantities A(m), and can be set in advance. If the correlation among the threshold of the minimum level control coefficient required to prevent clipping, the coefficient used to automatically adjust to an appropriate speech pressure, and the feature quantities A(m) is high, more ideal coefficients p1 and p2 can be calculated.

The balance setting unit 102B$a$ receives the coefficients p1 and p2 as inputs, makes a conditional evaluation so as not to cause speech quality deterioration (for example, distortions caused by the level control, an unnatural volume caused by the automatic volume control, noise, and the like), and outputs a provisional level control coefficient $TH_p$, provisional characteristic adjustment coefficients $G_p(\omega)$, and a provisional volume control coefficient GAINp based on the evaluation result.

Note that the provisional level control coefficient $TH_p$ and provisional characteristic adjustment coefficients $G_p(\omega)$ are decided according to the coefficient p1 by the same processing as in the first embodiment. As for the provisional volume control coefficient GAINp, the absolute value $|GAINp_1-p2|$ of the difference between a provisional volume control coefficient $GAINp_1$, which was decided one frame before the current frame, and the coefficient p2 is calculated, and when this absolute value is less than an upper limit γ ($|GAINp_1-p2|<\gamma$), the provisional volume control coefficient GAINp is output as the coefficient p2 intact.

On the other hand, when the absolute value is greater than the upper limit γ ($|GAINp_1-p2|>\gamma$), the provisional volume control coefficient GAINp is limited to γ when it is output. Note that the upper limit γ is a volume difference that audibly poses no problem, and is about 3 dB in general. However, the upper limit γ is not limited to this. By executing such processing, speech quality deterioration (unnatural volume caused by the automatic volume control) can be prevented.

The automatic volume adjustment unit 102E receives the provisional volume control coefficient GAINp as an input, executes smoothing processing for respective samples to suppress transient influences between neighboring frames, and outputs the volume control coefficients GAIN[n] to be set in the automatic volume correction unit 101C. More specifically, the automatic volume adjustment unit 102E calculates the volume control coefficients GAIN[n] according to:

$$GAIN[n] = \text{smooth}(GAIN[n-L], \ldots, GAIN[n-1], GAIN_p)$$

$$= \frac{\sum_{j=1}^{L} \varphi Lj \cdot GAIN[n-j] + \varphi p \cdot GAIN_p}{\sum_{j=1}^{S} \varphi Lj + \varphi p}$$

Note that the volume control coefficients GAIN[n] can be calculated using volume control coefficients GAIN[n−L] to GAIN[n−1], which were calculated S samples before the current sample. Also, φLj and φp are smoothing coefficients, which allow to change weights for the smoothing processing. Note that the automatic volume adjustment unit 102E need only suppress transient influences between neighboring frames, and may use, for example, smoothing processing described in Jpn. Pat. Appln. KOKAI Publication No. P2007-93827.

With this arrangement as well, the same effects as in the above embodiments can be obtained. Also, according to this arrangement, the volume can automatically adjusted to an appropriate speech pressure in addition to prevention of an excessive volume drop while preventing a digital signal from being clipped.

Note that the present invention is not limited to the aforementioned embodiments intact, and can be embodied by modifying required constituent elements without departing from the scope of the invention when it is practiced. By appropriately combining a plurality of required constituent elements disclosed in the embodiments, various inventions can be formed. For example, some of all the required constituent elements disclosed in the embodiments may be deleted.

Furthermore, required constituent elements described in different embodiments may be appropriately combined. For example, in the above embodiments, the characteristic adjustment unit 102 executes signal processing using a plurality of functional blocks, as shown in FIG. 2. Alternatively, the characteristic adjustment unit 102 can be implemented by one chip using a processor such as a DSP.

In this case, the characteristic adjustment unit 102 can execute signal processing according to the flowchart shown in FIG. 9. That is, after input signals x[n] are acquired in step 2a, the characteristic adjustment unit 102 executes the same processing as that of the feature quantity extraction unit 102A1 in step 2b, and executes the same processing as that of the regression arithmetic unit 102A2 in step 2c. Then, the characteristic adjustment unit 102 executes the same processing as that of the balance setting unit 102B in step 2d, and executes the same processes as those of the digital level adjustment unit 102C and characteristic adjustment unit 102D in step 2e.

In addition, even when various modifications may be made without departing from the scope of the present invention, the present invention can be carried out.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A signal characteristic adjustment apparatus which adjusts characteristics of an input signal, the apparatus comprising:
    a level control unit which controls a level of the input signal;
    a characteristic adjustment unit which adjusts characteristics of the input signal, the level of which is controlled by the level control unit; and
    a coefficient calculation unit which calculates a level control coefficient used to adjust level control of the level control unit and a characteristic adjustment coefficient used to adjust characteristic control of the characteristic adjustment unit based on a feature quantity of the input signal,
    wherein the coefficient calculation unit calculates a clipping prevention coefficient used to prevent clipping based on the feature quantity of the input signal, decides the level control coefficient based on the clipping prevention coefficient when the calculated clipping prevention coefficient is greater than a pre-set threshold, and decides the level control coefficient based on the pre-set threshold when the calculated clipping prevention coefficient is less than the pre-set threshold, and
    wherein the coefficient calculation unit calculates the clipping prevention coefficient based on feature quantities extracted from the input signal and an equation of square error minimum reference, which is prepared by executing, in advance, regression analysis of the feature quantities.

2. The apparatus according to claim 1, wherein the coefficient calculation unit comprises a feature quantity regression analysis unit which calculates the clipping prevention coefficient based on the feature quantities of the input signal, the characteristics of which are adjusted by the characteristic adjustment unit, and the equation of square error minimum reference, which is prepared by executing, in advance, regression analysis of the feature quantities.

3. The apparatus according to claim 1, wherein the coefficient calculation unit calculates the clipping prevention coefficient for each frame.

4. The apparatus according to claim 3, further comprising:
a processing unit which executes adaptive processing suited to the input signal,
wherein the coefficient calculation unit calculates the clipping prevention coefficient based on the adaptive processing.

5. A signal characteristic adjustment apparatus which adjusts characteristics of an input signal, the apparatus comprising:
a level control unit which controls a level of the input signal;
an automatic volume control unit which automatically controls a volume of the input signal, the level of which is controlled by the level control unit;
a characteristic adjustment unit which adjusts characteristics of the input signal, the volume of which is automatically controlled by the automatic volume control unit; and
a coefficient calculation unit which calculates, from the input signal, a level control coefficient as a coefficient used to adjust control of the level control unit, an automatic volume control coefficient used to adjust control of the automatic volume control unit, and a characteristic adjustment coefficient used to adjust control of the characteristic adjustment unit;
wherein the coefficient calculation unit comprises:
a clipping prevention coefficient calculation unit which calculates a clipping prevention coefficient used to prevent clipping and an appropriate volume coefficient used to adjust to an appropriate volume from the input signal; and
an automatic volume control coefficient calculation unit which decides the automatic volume control coefficient based on the calculated appropriate volume coefficient when a difference between the appropriate volume coefficient calculated by the clipping prevention coefficient calculation unit and a previously adjusted automatic volume control coefficient is less than a pre-set threshold, and decides the automatic volume control coefficient based on the pre-set threshold when the difference between the calculated appropriate volume coefficient and the previously adjusted automatic volume control coefficient, is greater than the pre-set threshold,
wherein the clipping prevention coefficient calculation unit calculates the clipping prevention coefficient and the appropriate volume coefficient based on feature quantities extracted from the input signal and an equation of square error minimum reference, which is prepared by executing, in advance, regression analysis of the feature quantities.

6. The apparatus according to claim 5, wherein the coefficient calculation unit calculates the clipping prevention coefficient for each frame.

7. The apparatus according to claim 6, further comprising:
a processing unit which executes adaptive processing suited to the input signal,
wherein the coefficient calculation unit calculates the clipping prevention coefficient based on the adaptive processing.

8. A signal characteristic adjustment method which adjusts characteristics of an input signal, the method comprising steps of:
controlling a level of the input signal;
adjusting characteristics of the input signal, the level of which is controlled in the step of controlling a level; and
calculating a level control coefficient used to adjust level control of the step of controlling a level and a characteristic adjustment coefficient used to adjust characteristic control of the step of adjusting characteristics based on a feature quantity of the input signal,
wherein in the step of calculating a level control coefficient, a clipping prevention coefficient used to prevent clipping is calculated based on the feature quantity of the input signal, the level control coefficient is decided based on the clipping prevention coefficient when the calculated clipping prevention coefficient is greater than a pre-set threshold, and the level control coefficient is decided based on the pre-set threshold when the calculated clipping prevention coefficient is less than the pre-set threshold, and
wherein in the step of calculating a level control coefficient, the clipping prevention coefficient is calculated based on feature quantities extracted from the input signal and an equation of square error minimum reference, which is prepared by executing, in advance, regression analysis of the feature quantities.

9. The method according to claim 8, wherein the step of calculating a level control coefficient comprises a step of calculating the clipping prevention coefficient based on the feature quantities of the input signal, the characteristics of which are adjusted in the step of adjusting characteristics, and the equation of square error minimum reference, which is prepared by executing, in advance, regression analysis of the feature quantities.

10. The method according to claim 8, wherein the clipping prevention coefficient is calculated for each frame.

11. The method according to claim 10, further comprising a step of:
executing adaptive processing suited to the input signal,
wherein the clipping prevention coefficient is calculated based on the adaptive processing.

* * * * *